(12) United States Patent
Aoki

(10) Patent No.: US 6,695,683 B2
(45) Date of Patent: Feb. 24, 2004

(54) SEMICONDUCTOR DEVICE WASHING APPARATUS AND A METHOD OF WASHING A SEMICONDUCTOR DEVICE

(75) Inventor: Hidemitsu Aoki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/810,156

(22) Filed: Mar. 16, 2001

(65) Prior Publication Data

US 2001/0021623 A1 Sep. 13, 2001

Related U.S. Application Data

(62) Division of application No. 09/316,248, filed on May 21, 1999, now Pat. No. 6,241,584.

(30) Foreign Application Priority Data

May 22, 1998 (JP) ............................................ 10-141738

(51) Int. Cl.[7] ................................................. B08B 3/02
(52) U.S. Cl. ............................ 451/41; 451/35; 451/54; 134/6
(58) Field of Search ............................... 451/41, 35, 54, 451/59, 63, 288; 216/88, 89; 134/6, 1, 26, 32, 36, 95.3, 153, 902; 15/97.1, 102, 88

(56) References Cited

U.S. PATENT DOCUMENTS

| | | | |
|---|---|---|---|
| 4,129,457 A | * 12/1978 | Basi | ............................... 134/2 |
| 4,258,508 A | 3/1981 | Wilson et al. | |
| 5,766,367 A | 6/1998 | Smith et al. | |
| 5,775,980 A | 7/1998 | Sasaki et al. | |
| 5,806,126 A | * 9/1998 | de Larios et al. | ............... 134/26 |
| 5,860,853 A | 1/1999 | Hasegawa et al. | |
| 5,868,866 A | * 2/1999 | Maekawa et al. | ............... 134/1 |
| 6,022,400 A | 2/2000 | Izumi et al. | |
| 6,033,486 A | * 3/2000 | Andros | ........................... 134/1 |
| 6,059,888 A | * 5/2000 | Hillman | .......................... 134/6 |
| 6,062,968 A | 5/2000 | Sevilla et al. | |
| 6,171,436 B1 | * 1/2001 | Huynh et al. | ................. 134/1.3 |
| 6,385,805 B2 | * 5/2002 | Konishi et al. | .............. 134/902 |
| 6,405,399 B1 | * 6/2002 | Farber et al. | ............ 134/122 R |

FOREIGN PATENT DOCUMENTS

| | | |
|---|---|---|
| JP | 59-41124 | 3/1984 |
| JP | 5-3184 | 1/1993 |
| JP | 5-267260 | 10/1993 |
| JP | 7-87010 | 3/1995 |
| JP | 9-92636 | 4/1997 |
| JP | 10-12584 | 1/1998 |
| JP | 10-120498 | 5/1998 |

OTHER PUBLICATIONS

"Post–Cmp cleaning of W and $S_iO_2$: A Model Study", by Igor J. Malik, et al., MRS. Symp. Proc. vol. 386 (1995), pp. 109–114.
The Japan Society of Applied Physics, 57th Prof., p. 637.
Japanese Unexamined Patent Publication (JP–A) No. Hei 9–277172; published Oct. 28, 1997.

* cited by examiner

Primary Examiner—Joseph J. Hail, III
Assistant Examiner—Anthony Ojini
(74) Attorney, Agent, or Firm—Scully, Scott, Murphy & Presser

(57) ABSTRACT

A semiconductor device washing apparatus washes a surface of a semiconductor wafer after a chemical mechanical polishing process is performed for the surface. A roll brush is placed on the surface of the semiconductor wafer so as to contact with the surface. A first chemical liquid tank contains first chemical liquid. A first exhaust nozzle sprays the first chemical liquid onto the surface of the semiconductor wafer. A second chemical liquid tank contains second chemical liquid. A second exhaust nozzle sprays the second chemical liquid onto the surface of the semiconductor wafer. The first chemical liquid and the second chemical liquid are splayed onto the surface of the semiconductor wafer on the condition that the roll brush and the semiconductor wafer are rotated.

22 Claims, 2 Drawing Sheets

SEMICONDUCTOR DEVICE WASHING APPARATUS AND A METHOD OF WASHING A SEMICONDUCTOR DEVICE

This application is a division of application Ser. No. 09/316,248, filed May 21, 1999, now U.S. Pat. No. 6,241,584.

BACKGROUND OF THE INVENTION

This invention relates to a semiconductor device washing apparatus and a method of washing the semiconductor device after a Chemical Mechanical Polishing (CMP) process.

Conventionally, irregularities are often formed on a surface of a semiconductor device having a laminate structure in a step of manufacturing the semiconductor device. The surface having the irregularities is flattened by the use of the known CMP (Chemical Mechanical Polishing) process.

This polishing process is generally carried out by using solution containing dense polishing particles (for example, silica particles, alumina particles) during the CPM process. These particles must be almost completely removed from a wafer surface after the CMP process to keep reliability of an electronic device and a desired cleaning degree of a manufacture line.

In particular, when a hydrophobic film, such as, a silicon nitride film and a polysilicon film, is polished, it is difficult to remove particles which are left on the hydrophobic surface in comparison with a hydrophilic surface. Therefore, a washing method of effectively removing the particles has been required.

A brush scrub method using a sheet-fed type spin washing apparatus is generally used as the method of removing the particles which are left on the wafer after the CMP process.

For example, the spin washing apparatus includes a roll blush 12, an exhaust nozzle 13, a chemical liquid tank 15, and a pure water exhaust nozzle 14, as illustrated in FIG. 1.

In this event, the roll brush 12 removes particles which are left on a wafer 11. In the exhaust nozzle 13, an exhaust hole is opposite to the wafer 11. Further, chemical liquid is contained in the chemical liquid tank 15. The chemical liquid is injected or sprayed from the exhaust hole towards or onto the wafer 11. Moreover, pure water is injected or sprayed from an exhaust hole of the pure water exhaust nozzle 14 towards or onto the wafer 11.

In the above-mentioned spin washing apparatus, the roll brush 12 is contacted with the wafer 11. The washing water is supplied from the chemical liquid tank 15 towards the wafer 11 through the exhaust nozzle 13.

Under this circumstance, the wafer 11 is washed by pure water which is injected from the pure water exhaust nozzle 14 on the condition that the wafer 11 and the roll brush 12 are rotated.

In this case, dilution ammonia solution (I. J. Malik et al.: MRS. Symp. Proc. Vol. 386, p.109 (1995)) or dilution hydrofluoric acid solution is used as the washing water other than the pure water. However, these solutions are not effective for washing the above-mentioned hydrophobic surface.

In contrast, a report has been made about an example in which hydrophobic property is improved to enhance the removing effect (or performance) by adding detergent during the CMP process and the subsequent washing process in the 57th prof. (p. 637, 8p-L-7) of [The Japan Society of Applied Physics]. Herein, it is to be noted that a main component of the washing solution may be uncertain in the above-mentioned report.

Further, disclosure has been made about a conventional example for obtaining a hydrophilic surface by adding alcohol liquid during the CMP process in Japanese Unexamined Patent Publication (JP-A) No. Hei. 9-277172.

However, the ammonia solution or the dilution hydrofluoric acid solution does not have capability for obtaining the hydrophilic surface. Consequently, it is not sufficiently effective to wash the hydrophobic surface.

On the other hand, although the ammonia water containing the detergent is effective, there is the following problem. Namely, it is easy that high-polymer organic substance constituting the detergent is left on the wafer after the washing process. Consequently, a washing step for removing the organic substance further becomes necessary.

Further, if a proper liquid wasting process is not performed for the detergent, the detergent gives an adverse effect for the environment. In consequence, it is necessary to prepare an expensive processing facility to carry out the proper process.

With respect to the example for adding the alcohol during the CMP process, the alcohol serves as a first washing liquid in a polishing apparatus for performing the CMP process. However, the alcohol does not serve as a final washing liquid for the subsequent step of depositing a film.

In general, the washing process in the polishing apparatus accompanies with contaminants inside the apparatus. Consequently, high cleaning washing can not be performed. As a result, an additional polishing apparatus is required to be arranged independently of the subsequent washing apparatus.

Further, when the hydrophobic surface, such as, the silicon nitride film and the polysilicon film, is exposed after the CPM process, it is difficult to remove the particles which are left on the hydrohobic surface as compared to the hydrophilic surface.

Therefore, a washing method for effectively removing the particles has been required.

SUMMARY OF THE INVENTION

It is therefore an object of this invention to provide a semiconductor device washing apparatus which is capable of improving removing performance of polishing particles.

It is another object of this invention to provide a semiconductor device washing apparatus in which particles almost does not remain on a wafer after a CMP process.

It is further object of this invention to provide a semiconductor device washing apparatus which is capable of readily processing wasting liquid.

According to this invention, a semiconductor device washing apparatus washes a surface of a semiconductor wafer after a chemical mechanical polishing process is performed for the surface.

Under this circumstance, a roll brush is placed on the surface of the semiconductor wafer so as to contact with the surface.

Further, a first chemical liquid tank contains first chemical liquid. A first exhaust nozzle sprays the first chemical liquid onto the surface of the semiconductor wafer.

Moreover, a second chemical liquid tank contains second chemical liquid. A second exhaust nozzle sprays the second chemical liquid onto the surface of the semiconductor wafer.

With such a structure, the first chemical liquid and the second chemical liquid are splayed onto the surface of the semiconductor wafer on the condition that the roll brush and the semiconductor wafer are rotated.

In this condition, polishing particles are left on the surface of the semiconductor wafer after the chemical mechanical polishing process. The roll brush removes the polishing particles from the surface of the semiconductor wafer.

In this case, the first exhaust nozzle has a first exhaust hole while the second exhaust nozzle has a second exhaust hole. Each of the first exhaust hole and the second exhaust hole is opposite to the surface of the semiconductor wafer. The first chemical liquid is sprayed onto the surface via the first exhaust hole while the second chemical liquid is sprayed onto the surface via the second exhaust hole.

In this event, the first chemical liquid comprises ammonia liquid while the second chemical liquid comprises alcohol liquid.

The ammonia liquid preferably comprises lower alcohol. In this event, the lower alcohol may be at least one selected from the group consisting of ethanol, methanol, and isopropyl alcohol.

Herein, the surface of the semiconductor wafer is hydrophobic. The hydrophobic surface is changed into a hydrophilic surface by the use of the alcohol liquid. In this event, the hydrophobic surface is changed into the hydrophilic surface in order to enhance removing performance of the polishing particles which are left on the semiconductor surface. The hydrophobic surface may comprise a surface in which a silicon nitride film or a polysilicon film is exposed.

Thus, the hydrophobic wafer surface is changed into the hydrophilic surface by adding the alcohol liquid, as mentioned before. Thereby, the removing performance of the particles is largely improved.

Further, the alcohol liquid is consisted of low molecular as compared to the detergent. Consequently, it is difficult that the particles are left on the wafer after the CMP process. Moreover, the alcohol liquid can be readily wasted in comparison with the detergent.

Moreover, this invention is effective for the wafer having the exposed surface which readily becomes hydrophobic, such as, the silicon nitride film and the polysilicon film after the CMP process. Under this condition, the polishing particles, which are left on the wafer, can be effectively removed.

Consequently, reliability of the semiconductor device can be enhanced. Further, cross contamination of the manufacturing line can be effectively suppressed. As a result, the manufacturing yield can be improved.

Moreover, the substance, such as, the detergent is not used in this invention. This is because it is difficult to waste the detergent. In consequence, the environment is not destroyed, and cost for wasting washing liquid can be largely reduced.

DESCRIPTION OF THE PREFERRED EMBODIMENTS

Figure 1:
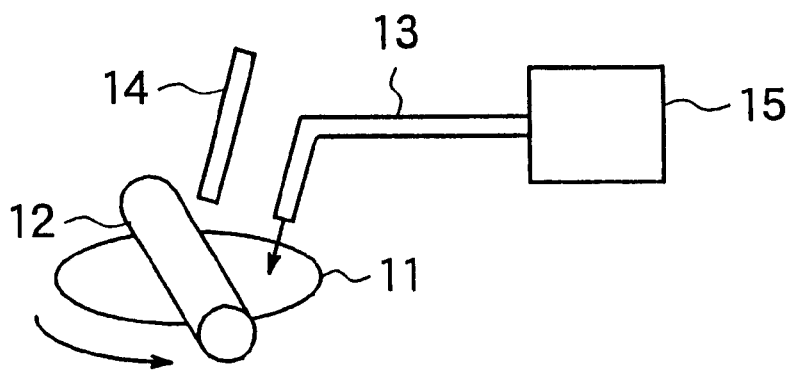
FIG. 1 is a schematic structure diagram showing an example of a conventional brush scrub washing apparatus.
Figure 2:
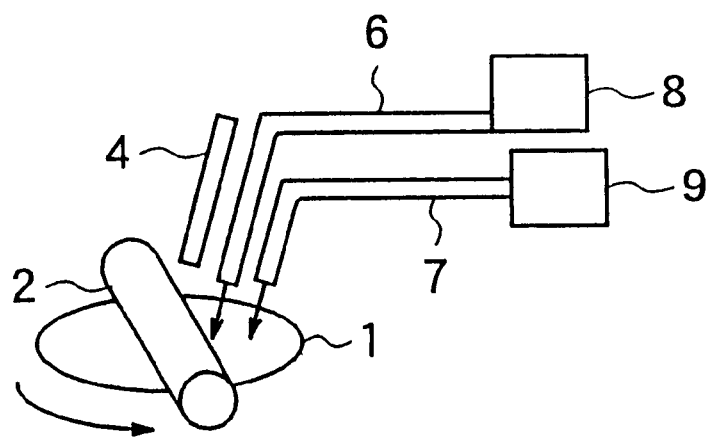
FIG. 2 is a schematic structure diagram showing a semiconductor device washing apparatus according to a first embodiment of this invention.

Referring to FIG. 2, description will be made about a semiconductor device washing apparatus according to a first embodiment of this invention.

In the first embodiment, a sheet-fed type and roll type of brush scrub washing apparatus is used after Chemical Mechanical Polishing (CMP) process.

The washing apparatus includes a roll blush 2, a first exhaust nozzle 6, a chemical liquid tank 8, and a pure water exhaust nozzle 4, a second exhaust nozzle 7, and a second chemical liquid tank 9, as illustrated in FIG. 2.

In this event, the roll brush 2 removes particles which are left on a semiconductor wafer 1. In the first exhaust nozzle 6, an exhaust hole is opposite to the wafer 1. Further, first chemical liquid is contained in the first chemical liquid tank 8. The first chemical liquid contained in the first chemical liquid tank 8 is injected or sprayed from the exhaust hole towards or onto the wafer 1.

Moreover, pure water is injected or sprayed from an exhaust hole of the pure water exhaust nozzle 4 towards or onto the wafer 1. Further, second chemical liquid is contained in the second chemical liquid tank 9. The second chemical liquid contained in the second chemical liquid tank 9 is injected or sprayed from the exhaust hole towards or onto the wafer 1.

In this case, the first chemical liquid includes ammonia liquid while the second chemical liquid includes alcohol liquid.

In the above-mentioned washing apparatus, the roll brush 2 is contacted with the wafer 1. On this condition, The first chemical liquid and the second chemical liquid (namely, washing water) are supplied from the first chemical liquid tank 8 and the second chemical liquid tank 9 towards the wafer 1 through the first exhaust nozzle 6 and the second exhaust nozzle 7.

Under this circumstance, the wafer 1 is washed by pure water which is injected from the pure water exhaust nozzle 4 on the condition that the wafer 1 and the roll brush 2 are rotated.

With such a structure, ammonia liquid (for example, ammonia liquid of 0.05%) from the first chemical liquid tank 8 is supplied onto the wafer 1 through the first exhaust nozzle 6 on the condition that the wafer 1 and the roll brush 2 are rotated. Herein it is to be noted that a surface of a silicon nitride film is exposed on the wafer 1.

At the same time, the alcohol liquid (for example, alcohol liquid of 0.1%) from the second chemical liquid tank 9 is supplied onto the wafer 1 through the second exhaust nozzle 7.

After the washing process (for example, about 40 seconds), the pure water is supplied onto the wafer 1 through the pure water exhaust nozzle 4 to perform a rinse process (for example, about 20 seconds).

In this event, the first chemical liquid, the second chemical liquid and the pure water may not be directly supplied onto the wafer 1, and may be dropped onto the roll brush 2. The processed wafer 1 is transferred to adjacent washing chamber (not shown).

Alternatively, the alcohol liquid may be first supplied from the second exhaust nozzle 7 onto the wafer 1 for first 10 seconds to change the surface of the wafer 1 into the hydrophilic surface in the sequence of the washing process. Thereafter, the ammonia liquid may be supplied from the first exhaust nozzle 6 for the subsequent 40 seconds to perform the washing process.

In this case, the alcohol liquid includes lower alcohol liquid. This lower alcohol liquid includes ethanol, methanol, or isopropyl alcohol (IPA). Herein, concentration of the ammonia liquid preferably falls within the range between 0.001% and 10% while concentration of the alcohol liquid desirably falls within the range between 0.005% and 10%.

Figure 3:
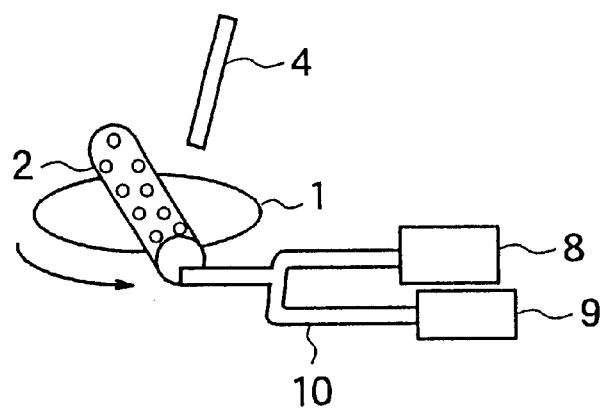
FIG. 3 is a schematic structure diagram showing a semiconductor device washing apparatus according to a second embodiment of this invention.

Subsequently, description will be made about a semiconductor device washing apparatus according to a second embodiment of this invention with reference to FIG. 3.

In the second embodiment, chemical liquid is supplied from an internal of a roll brush 2. For example, ammonia liquid from a first chemical liquid tank 8 and isopropyl alcohol (IPA) from a second chemical liquid tank 9 are mixed in a tube 10, and is supplied to the internal of the roll brush 2 through the tube 10.

The supplied chemical liquid is injected or sprayed onto the wafer 1 from fine holes which are arranged or opened on the roll brush 2. Herein, it is to be noted that a silicon nitride film surface is exposed on the wafer 1. In this example, each chemical liquid may be supplied with the above-mentioned time difference, like the first embodiment.

The alcohol liquid preferably includes lower alcohol, such as, methanol or ethanol. Herein, concentration of the ammonia liquid preferably falls within the range between 0.001% and 10% while concentration of the alcohol liquid desirably falls within the range between 0.005% and 10%.

Although the chemical liquid is supplied from the internal of the roll brush 2 onto the wafer 1, the chemical liquid may be dropped onto the roll brush 2 in the second embodiment.

Further, the brush is not limited to the roll type, but it may be a disk type or a pen type.

Moreover, this invention is also effective for the wafer 1 having an exposed surface which readily becomes hydrophobic, such as, a polysilicon film other than the silicon nitride film surface.

Figure 4:
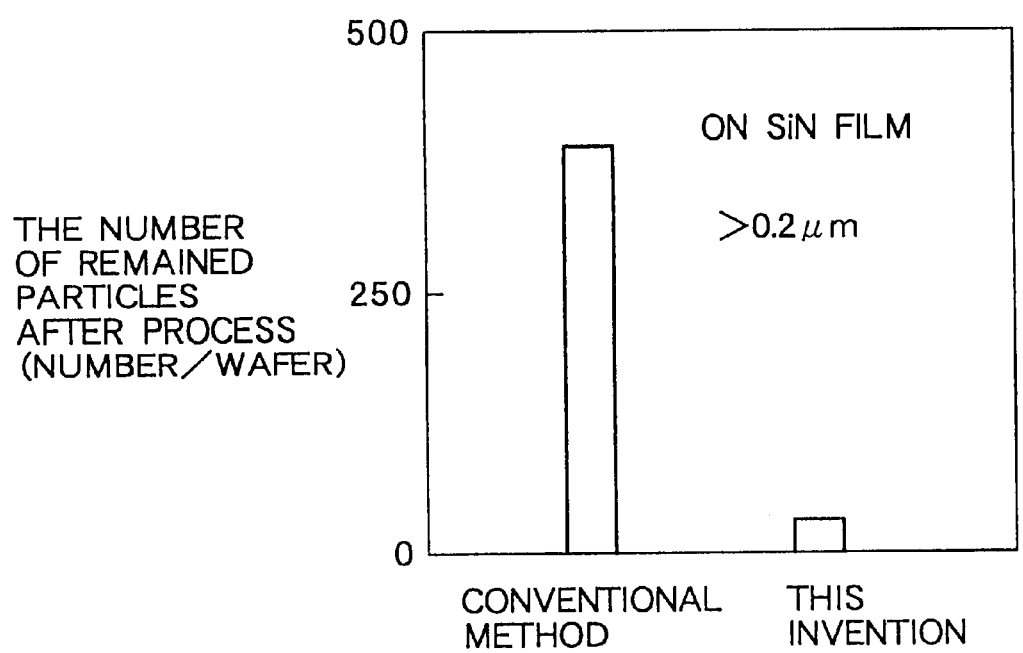
FIG. 4 is a graph showing removing result of particles in accordance with the semiconductor device washing apparatus illustrated in FIG. 2.

In FIG. 4, a result, which is experimented using the washing apparatus according to the first embodiment, is illustrated.

First, the wafer 1 was washed after the CMP process was carried out for the silicon nitride film. Thereafter, the number of the silica particles (0.2 $\mu$m or more in particle diameter), which are left on the wafer 1, was measured.

As a result, the particles having the number of 380/wafer in average were left on the wafer in the conventional washing apparatus using the ammonia liquid, as illustrated in FIG. 4.

In contrast, the particles having the number of 32/wafer in average were left on the wafer in the washing apparatus according to this invention using IPA and the ammonia liquid, as illustrated in FIG. 4.

Thus, it is found out that from FIG. 4 that the remained number of the particles in this invention is considerably smaller than that in the conventional case.

What is claimed is:

1. A semiconductor device washing apparatus which washes a surface of a semiconductor wafer after a chemical mechanical polishing process is performed for the surface, comprising:
   a roll brush which is placed on the surface of the semiconductor wafer so as to contact with the surface;
   a first chemical liquid tank which contains first chemical liquid;
   a first exhaust nozzle which sprays the first chemical liquid onto the surface of the semiconductor wafer;
   a second chemical liquid tank which contains second chemical liquid; and
   a second exhaust nozzle which sprays the second chemical liquid onto the surface of the semiconductor wafer;
   the first chemical liquid and the second chemical liquid being sprayed onto the surface of the semiconductor wafer simultaneously on the condition that the roll brush and the semiconductor wafer are rotated.

2. An apparatus as claimed in claim 1, wherein:
polishing particles are left on the surface of the semiconductor wafer after the chemical mechanical polishing process, and
the roll brush removes the polishing particles from the surface of the semiconductor wafer.

3. An apparatus as claimed in claim 1, wherein:
the first exhaust nozzle has a first exhaust hole while the second exhaust nozzle has a second exhaust hole,
each of the first exhaust hole and the second exhaust hole being opposite to the surface of the semiconductor wafer, and
the first chemical liquid is sprayed onto the surface via the first exhaust hole while the second chemical liquid is sprayed onto the surface via the second exhaust hole.

4. An apparatus as claimed in claim 1, wherein:
the first chemical liquid comprises ammonia liquid while the second chemical, liquid comprises alcohol liquid.

5. An apparatus as claimed in claim 4, wherein:
the ammonia liquid comprises lower alcohol.

6. An apparatus as claimed in claim 5, wherein:
the lower alcohol comprises at least one selected from the group consisting of ethanol, methanol, and isopropyl alcohol.

7. An apparatus as claimed in claim 4, wherein:
concentration of the ammonia liquid falls within the range between 0.001% and 10%.

8. An apparatus as claimed in claim 4, wherein:
concentration of the alcohol liquid falls within the range between 0.005% and 10%.

9. An apparatus as claimed in claim 4, wherein:
the surface of the semiconductor wafer is hydrophobic, and
the hydrophobic surface is changed into a hydrophilic surface by the use of the alcohol liquid.

10. An apparatus as claimed in claim 9, wherein:
the hydrophobic surface is changed into the hydrophilic surface in order to enhance removing performance of the polishing particles which are left on the semiconductor surface.

11. An apparatus as claimed in claim 9, wherein:
the hydrophobic surface comprises a surface in which a silicon nitride film or a polysilicon film is exposed.

12. An apparatus as claimed in claim 1, further comprising:
a third exhaust nozzle which sprays pure water onto the surface of the semiconductor wafer.

13. An apparatus as claimed in claim 12, wherein:
the first liquid, the second liquid and the pure water are dropped onto the roll brush.

14. A semiconductor device washing apparatus which washes a surface of a semiconductor wafer after a chemical mechanical polishing process is performed for the surface, comprising:
   a roll brush which is placed on the surface of the semiconductor wafer so as to contact with the surface, the roll brush having a plurality of fine holes;
   a first chemical liquid tank which contains first chemical liquid;
   a second chemical liquid tank which contains second chemical liquid; and a tube which mixes the first chemical liquid with the second chemical liquid and which supplies the mixed liquid inside the roll brush;

the mixed liquid being sprayed onto the surface of the semiconductor wafer through the fine holes of the roll brush on the condition that the roll brush and the semiconductor wafer are rotated, the first chemical liquid comprises ammonia liquid while the second chemical liquid comprises alcohol liquid, and the ammonia liquid comprises lower alcohol.

15. An apparatus as claimed in claim 14, wherein:

polishing particles are left on the surface after the chemical mechanical polishing process, and the roll brush removes the polishing particles from the surface of the semiconductor wafer.

16. An apparatus as claimed in claim 14, wherein:

the lower alcohol comprises at least one selected from the group consisting of ethanol, methanol, and isopropyl alcohol.

17. An apparatus as claimed in claim 14, wherein:

concentration of the ammonia liquid falls within the range between 0.001% and 10%.

18. An apparatus as claimed in claim 14, wherein:

concentration of the alcohol liquid falls within the range between 0.005% and 10%.

19. An apparatus as claimed in claim 14, further comprising:

a third exhaust nozzle which sprays pure water onto the surface of the semiconductor wafer.

20. An apparatus as claimed in claim 14, wherein:

the surface of the semiconductor wafer is hydrophobic, and the hydrophobic surface is changed into a hydrophilic surface by the use of the alcohol liquid.

21. An apparatus as claimed in claim 20, wherein:

the hydrophobic surface is changed into the hydrophilic surface in order to enhance removing performance of the polishing particles.

22. An apparatus as claimed in claim 20, wherein:

the hydrophobic surface comprises a surface in which a silicon nitride film or a polysilicon film is exposed.

* * * * *

UNITED STATES PATENT AND TRADEMARK OFFICE
CERTIFICATE OF CORRECTION

PATENT NO. : 6,695,683 B2
DATED : February 24, 2004
INVENTOR(S) : Hidemitsu Aoki It is certified that error appears in the above-identified patent and that said Letters Patent is hereby corrected as shown below:

<u>Title page</u>,
Item [30], Foreign Application Priority Data, "10-141738" should read
-- 10-141748 --

Signed and Sealed this

Eighteenth Day of May, 2004

JON W. DUDAS
*Acting Director of the United States Patent and Trademark Office*